US012763149B2

(12) United States Patent
Luo et al.

(10) Patent No.: US 12,763,149 B2
(45) Date of Patent: Oct. 13, 2026

(54) LOGICAL BLOCK CONSTRUCTION FOR PHYSICAL BLOCKS COMPRISING MULTIPLE ERASE BLOCKS COUPLED TO A SAME STRING

(71) Applicant: Micron Technology, Inc., Boise, ID (US)

(72) Inventors: Xiangang Luo, Fremont, CA (US); Kishore K. Muchherla, San Jose, CA (US); Hong Lu, San Jose, CA (US); Akira Goda, Setagaya (JP); Shyam Sunder Raghunathan, Woodlands (SG); Peter Feeley, Boise, ID (US); Emilio Camerlenghi, Bergamo (IT); Paolo Tessariol, Arcore (IT)

(73) Assignee: Micron Technology, Inc., Boise, ID (US)

( * ) Notice: Subject to any disclaimer, the term of this patent is extended or adjusted under 35 U.S.C. 154(b) by 139 days.

(21) Appl. No.: 18/781,524

(22) Filed: Jul. 23, 2024

(65) Prior Publication Data

US 2025/0140323 A1 May 1, 2025

Related U.S. Application Data

(60) Provisional application No. 63/545,581, filed on Oct. 25, 2023.

(51) Int. Cl.

*G11C 16/16* (2006.01)
*G11C 16/04* (2006.01)
*G11C 16/08* (2006.01)

(52) U.S. Cl.

CPC .......... *G11C 16/16* (2013.01); *G11C 16/0483* (2013.01); *G11C 16/08* (2013.01)

(58) Field of Classification Search

None

See application file for complete search history.

(56) References Cited

U.S. PATENT DOCUMENTS

2019/0286556 A1* 9/2019 You .................... G06F 12/0246
2024/0062825 A1* 2/2024 Lu .......................... G11C 16/26

* cited by examiner

*Primary Examiner* — Alfredo Bermudez Lozada

(74) *Attorney, Agent, or Firm* — Brooks, Cameron & Huebsch, PLLC

(57) ABSTRACT

An apparatus comprises a memory array comprising a plurality of physical blocks of memory cells each comprising more than two erase blocks, with each of the more than two erase blocks of each respective physical block comprising memory cells coupled to a same string of memory cells corresponding to the respective physical block. A controller can operate the memory array in accordance with a logical block implementation in which each logical block comprises: a first erase block adjacent to a first end of a particular string corresponding to a first physical block; and a second erase block. The second erase block is either: located in the first physical block and not adjacent to a second end of the particular string corresponding to the first physical block; or located in a second physical block and adjacent to a first end of a particular string corresponding to the second physical block.

19 Claims, 8 Drawing Sheets

LOGICAL BLOCK CONSTRUCTION FOR PHYSICAL BLOCKS COMPRISING MULTIPLE ERASE BLOCKS COUPLED TO A SAME STRING

PRIORITY INFORMATION

This application claims the benefits of U.S. Provisional Application No. 63/545,581, filed on Oct. 25, 2023, the contents of which are incorporated herein by reference.

TECHNICAL FIELD

Embodiments of the disclosure relate generally to memory systems, and more specifically, relate to apparatuses and methods for logical block construction for physical blocks comprising multiple erase blocks coupled to a same string.

BACKGROUND

A memory system can include a memory sub-system, which can be a storage device, a memory module, or a hybrid of a storage device and a memory module. Examples of a storage device include a solid-state drive (SSD), a Universal Flash Storage (UFS) drive, a secure digital (SD) card, an embedded Multiple Media Card (eMMC), and a hard disk drive (HDD). Examples of memory modules include a dual in-line memory module (DIMM) and various types of non-volatile dual in-line memory modules (NVDIMMs). Memory systems include one or more memory components (e.g., memory devices) that store data. The memory components can be, for example, non-volatile memory components (e.g., NAND flash memory devices) and volatile memory components (e.g., DRAM devices). In general, a host system can utilize a memory system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
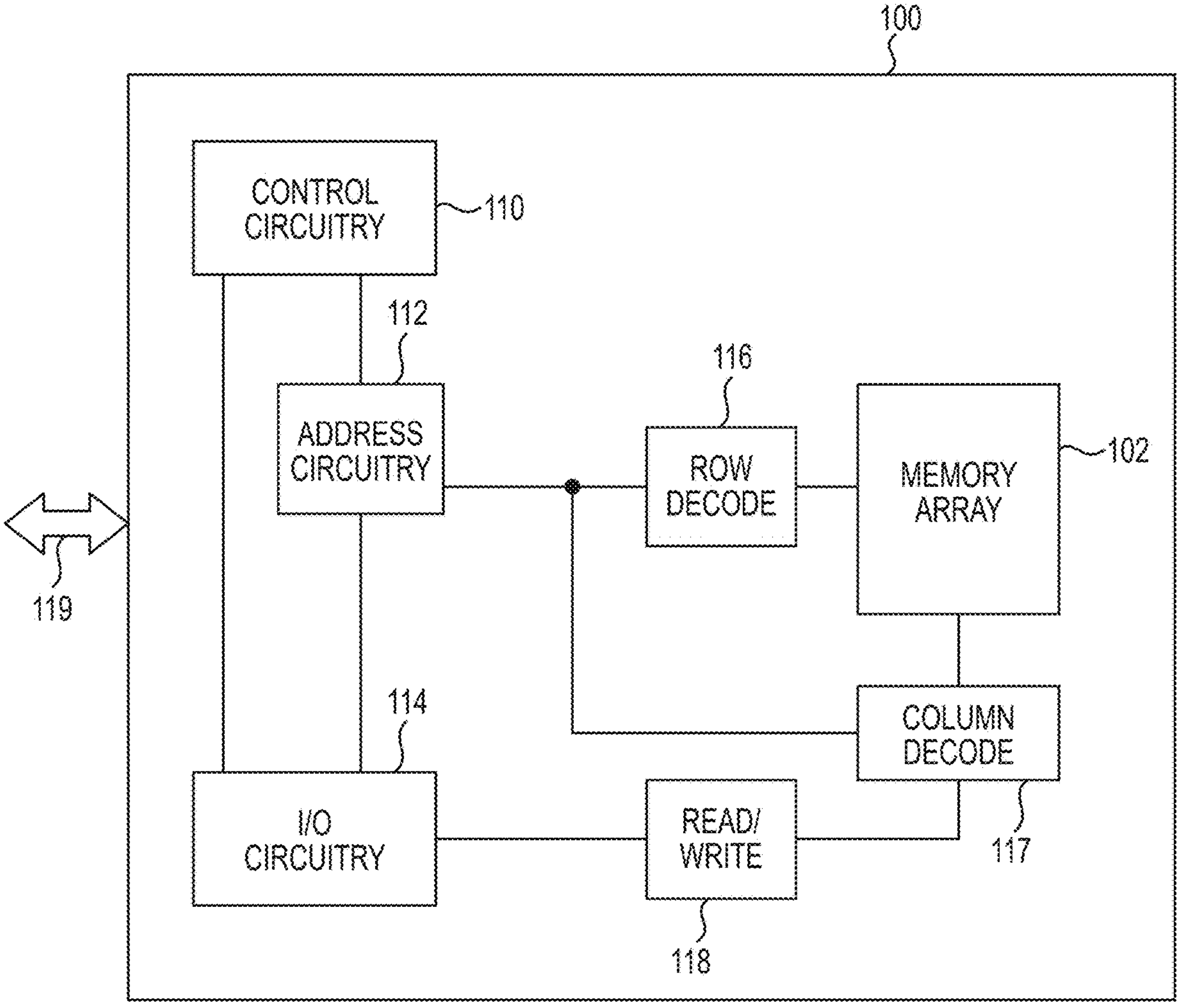
FIG. 1 illustrates an example portion of a memory system including a memory device having an array in accordance with various embodiments of the present disclosure.

Aspects of the present disclosure are directed to apparatuses and methods for logical block construction for physical blocks comprising multiple erase blocks coupled to a same string. Various types of memory, such as NAND flash memory, include a memory array of many memory cells that can be arranged in row and column fashion and grouped in physical blocks. The cells can include a charge storage node such as a floating gate or charge-trap layer which allows the cells to be programmed to store one more bits by adjusting the charge stored on the storage node. Generally, an erase operation (e.g., a "block erase") is performed to erase all of the cells of a physical block together as a group.

Three-dimensional (3D) flash memory (e.g., a 3D NAND memory array) can include multiple strings of memory cells with each string comprising multiple series-coupled (e.g., source to drain) memory cells in a vertical direction, with the memory cells of a string sharing a common channel region. Each memory cell of a string can correspond to a different tier of the memory array, with a group of strings sharing multiple access lines, which may be referred to as word lines (WLs). Each access line can be coupled to respective memory cells of each string in the group of strings (e.g., the memory cells of a particular tier of the memory array). Groups of strings are coupled to respective sense lines, which may be referred to as data lines or bit lines (BLs), of a group of sense lines. The cells of the strings can be positioned between a drain-side select gate (referred to as a select gate drain (SGD)) and a source-side select gate (referred to as select gate source (SGS)) used to control access to the strings. A 3D NAND array can be a replacement gate (RG) NAND array or a floating gate NAND array, for example.

A 3D memory array can comprise multiple physical blocks each comprising a plurality of memory pages (e.g., physical pages of cells than can store one or more logical pages of data). In various previous approaches, a block of memory cells corresponds to a smallest group of memory cells that can be erased. For example, in prior approaches it is not possible to erase some of the memory cells of a block while maintaining data in other memory cells of the block.

Some prior approaches that may provide an ability to erase some memory cells of a block while maintaining data in other memory cells of the block can suffer various drawbacks. For example, independently operating groups of cells within a physical block can result in various disturb (e.g., program disturb, read disturb, program verify disturb, erase disturb, etc.) to the other groups of cells within the physical block. Such disturb can result in threshold voltage (Vt) shifts of the victim cells, which can lead to increased bit error rates (BERs) and/or data loss, for example.

As described further herein, some memory arrays can include physical blocks having multiple erase blocks therein. As used herein, an "erase block" refers to a group of cells that are configured to be erased together as a group and that share a same string as one or more additional groups of cells (e.g., one or more additional erase blocks). An erase block may also be referred to as a "deck." As such, a physical block of cells can include multiple decks each capable of undergoing program/erase (P/E) cycling irrespective of the other decks.

Providing multiple erase blocks per physical block can provide benefits such as providing the ability to implement a logical block size that is smaller than a physical block size. A reduced logical block size can, for example, reduce the overhead associated with providing "spare" blocks used for system maintenance and/or other purposes. Since such spare blocks are not usable by the customer, it is beneficial to reduce the percentage overhead attributed to them. However, implementing a logical block size at the erase block level can introduce some challenges associated with operating (e.g., programming and/or erasing) the array.

For example, an erase operation can involve gate induced drain leakage (GIDL) hole injection into 3D NAND strings from either a drain side or a source side of the strings. If a physical block includes intermediate decks (e.g., erase blocks that are not adjacent to either a source side or a drain side of a string), it can be difficult to pass the generated GIDL holes to the intermediate decks, especially if the edge decks (e.g., erase blocks adjacent to either a source side or a drain side of the string) are in a programmed state. As used herein, intermediate decks may be referred to as "middle" decks.

Programming physical blocks comprising more than two decks, such that there are one or more middle decks, can also introduce operation complexities. For example, a programming operation is generally performed on an erased physical block and the physical pages (e.g., rows) are programmed sequentially from one end of the string to the other end of the string (e.g., source to drain or drain to source) with a seed voltage being passed through the string from one end to the other. Accordingly, since multiple decks within a physical block can be separately and independently programmed, it can be particularly difficult to program middle decks. For instance, if the seed voltage is generated from a drain side of the string and the deck adjacent to the drain side is programmed (e.g., with user data), it can be more difficult to pass the seed through the drain side deck to the middle deck than if the drain side deck was erased. Similarly, if the seed voltage is generated from a source side of the string and the deck adjacent to the source side is programmed (e.g., with user data), it can be more difficult to pass the seed through the source side deck to the middle deck than if the source side deck was erased.

Various embodiments of the present disclosure address the above and other deficiencies by providing apparatuses and methods for memory management involving an improved logical block architecture and implementation for memory arrays having physical blocks comprising multiple decks coupled to a same string. Various embodiments enable a logical block size that is smaller than a physical block size while overcoming challenges associated with operating (e.g., programming and/or erasing) physical blocks that include middle erase blocks that are not adjacent to either a source end or a drain end of string (e.g., physical blocks having three or more decks). Embodiments can increase the quantity of logical blocks per plane as compared to instances in which the logical block size matches the physical block size, which can enable a reduction in the quantity of physical blocks per plane without significantly increasing a spare block penalty. As described further herein, some embodiments in which physical blocks comprise three decks involve implementing (e.g., forming) three logical blocks out of two physical blocks (e.g., each logical block corresponding to a grouping of two decks), which implies a logical block size that is ⅔ (0.66) times the physical block size. The logical blocks are implemented such that each has access to either a source side of a string or a drain side of the string. The constituent decks of a particular logical block may be physically located in a same physical block (e.g., such that they are coupled to a same string) or in different physical blocks.

FIG. 1 illustrates an example portion of a memory system including a memory device 100 having and array 102 in accordance with various embodiments of the present disclosure. The memory array 102 can be a 3D NAND array such as described further in association with FIG. 2, for example. The array can comprise single level cells (SLCs) storing 1 bit per cell, multilevel cells (MLCs) storing 2 bits per cell, triple level cells (TLCs) storing three bits per cell, or quad level cells (QLCs) storing 4 bits per cell, for example. Embodiments are not limited to a particular type of memory cell. The memory device 100 can be part of a memory system such as memory system 890 described in FIG. 8.

The memory device 100 includes control circuitry 110, address circuitry 112, and input/output (I/O) circuitry 114 used to communicate with an external device via an interface 119. The interface 119 can include, for example, a bus used to transmit data, address, and control signals, among other signals between the memory device 100 and an external host device, which can include a controller (e.g., system controller such as controller 891 shown in FIG. 8), host processor (e.g., host 892 shown in in FIG. 8), etc., that is capable of accessing the memory array 102. As an example, the memory device 100 can be within a system such as an SSD with the interface 119 coupling the memory device 100 to a system controller. The interface 119 can include a combined address, control, and data bus or separate busses depending on the particular physical interface and corresponding protocol. The interface 119 can be an Open NAND Flash Interface (ONFI) interface or a Non-Volatile Memory Express (NVMe) interface, a serial attached SCSI (SAS), a serial AT attachment (SATA) interface, a peripheral component interconnect express (PCIe) interface, a universal flash storage (UFS) interface, an I2C/I3C interface, and/or other suitable interface (e.g., a parallel interface); however, embodiments are not limited to a particular type of interface or protocol.

The control circuitry 110 can decode signals (e.g., commands) received via interface 119 and executed to control operations performed on the memory array 102. The operations can include data programming operations, which may be referred to as write operations, data read operations, which may be referred to as sensing operations (and can include program verify operations), data erase operations, etc. The control circuitry 110 can cause various groups of memory cells (e.g., pages, blocks, erase blocks, etc.) to be selected or deselected in association with performing memory operations on the array 102. The control circuitry 110 can comprise a state machine, a sequencer, and/or some other type of control circuitry, which may be implemented in the form of hardware, firmware, or software, or any combination thereof.

The I/O circuitry 114 is used for bi-directional communication of data between the memory array 102 and the external device via interface 119. The address circuitry 112, which can include a register, can latch address signals received thereto, and the address signals can be decoded by a row decoder 116 and a column decoder 117 to access the memory array 102. The memory device 100 includes read/write circuitry 118 used to read data from and write data to the memory array 102. As an example, the read/write circuitry can include various latch circuitry, drivers, sense amplifiers, buffers, etc. Data can be read from the memory array 102 by sensing voltage and/or current changes on bit lines of the memory array 102.

Figure 2:
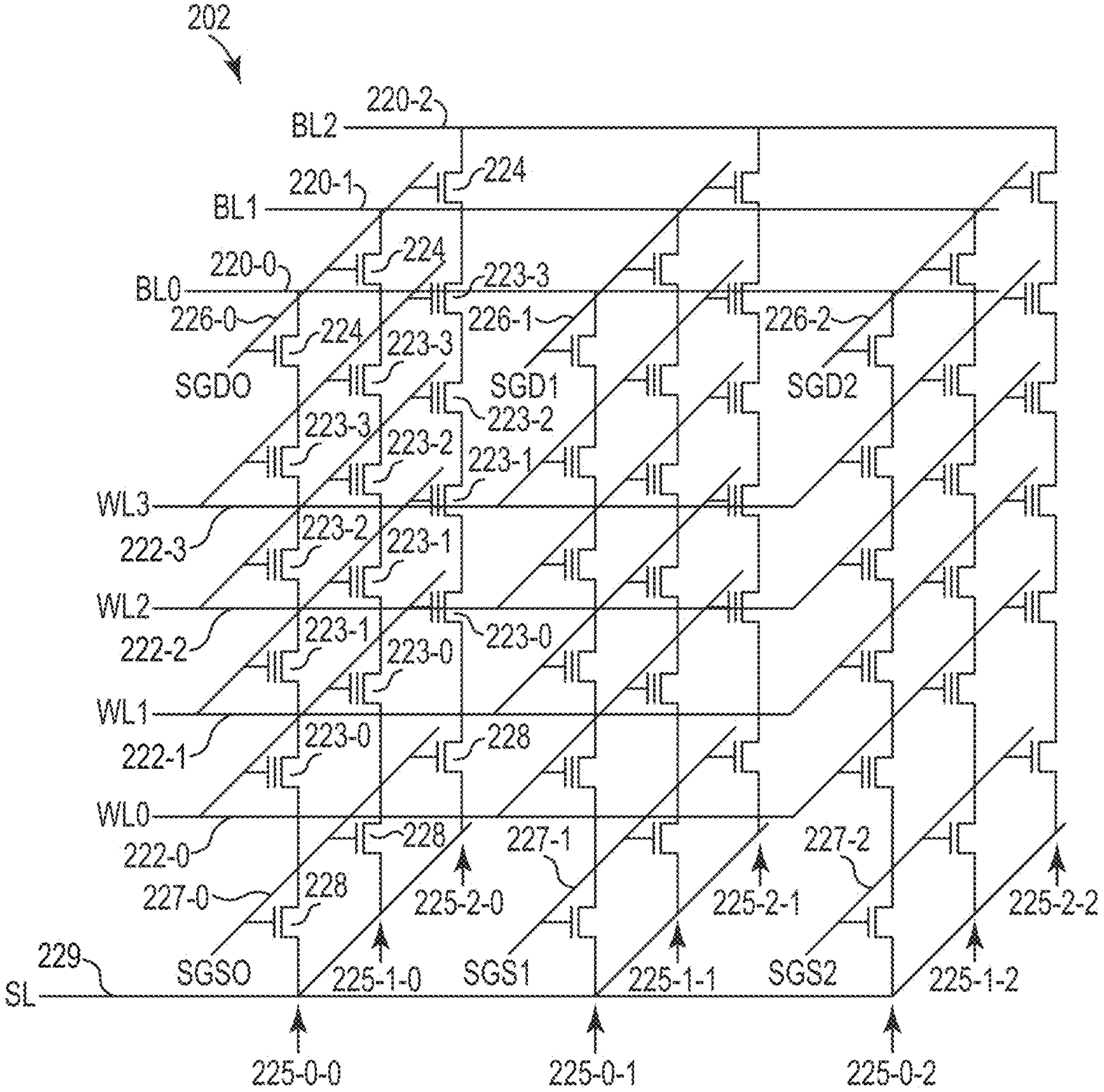
FIG. 2 is a schematic diagram illustrating an example memory array that can be operated in accordance with various embodiments of the present disclosure.

FIG. 2 is a schematic diagram illustrating an example memory array 202 in accordance with various embodiments of the present disclosure. The memory array 202 can be located in a memory device such as memory device 100 described in FIG. 1, for example. The memory array 202 is a 3D NAND array (e.g., RG NAND array or a floating gate NAND array).

The memory array 202 comprises a number of access lines (word lines) 222-0 (WL0), 222-1 (WL1), 222-2 (WL2), and 222-3 (WL3) and a number of sense lines (bit lines) 220-0 (BL0), 220-1 (BL1), and 220-2 (BL2) coupled to multiple strings 225-0-0, 225-0-1, 225-0-2, 225-1-0, 225-1-1, 225-1-2, 225-2-0, 225-2-1, and 225-2-2. The word lines, bit lines, and strings are collectively referred to as word lines 222, bit lines 220, and strings 225, respectively. Although four word lines 222, three bit lines 220, and nine strings 225 are shown, embodiments are not so limited.

Each of the strings 225 comprises a number of memory cells (referred to collectively as memory cells 223) located between a select transistor 224 and a select transistor 228. For example, as shown in FIG. 2, strings 225-0-0, 225-1-0, and 225-1-2 each respectively comprise memory cells 223-0, 223-2, 223-2, and 223-3 located between select transistors 224 and 228 (e.g., respective drain-side select gate (SGD) 224 and source-side select gate (SGS) 228). The memory cells 223 can be floating gate transistors or charge trap cells with the cells 223 of a given string 225 sharing a common channel region (e.g., pillar). As shown, the memory cells 223 of a given string are series-coupled source to drain between the SGD transistor 224 and the SGS.

The memory cells 223 of the strings 225 are stacked vertically such that they are located on distinct tiers/levels of the memory array 202. Each word line 222 can be commonly coupled to all the memory cells at a particular tier/level. For example, word line 222-0 can be coupled to (e.g., as the control gate) the nine memory cells 223-0 corresponding to the nine respective strings 225.

The select gate transistors 224 and 228 can be controlled (e.g., turned on/off) via the corresponding select gate signals SGD0, SGD1, SGD2, SGS0, SGS1, and SGS2 in order to couple the strings 225 to their respective bit lines 220 and a common source line (SL) 229 during memory operations (e.g., reads, writes, erases). As shown in FIG. 2, the select gate signals SGD0, SGD1, and SGD2 are provided (e.g., to the gates of transistors 224) via respective conductive lines 226-0, 226-1, and 226-2, and the select gate signals SGS0, SGS1, and SGS2 are provided (e.g., to the gates of transistors 228) via respective conductive lines 227-0, 227-1, and 227-2. Although the signals SGS0, SGS1, and SGS2 are shown on separate conductive lines 227, in some embodiments the conductive lines 227-0, 227-1, and 227-2 may be coupled via a common SGS line.

To perform memory operations on the array 202, particular voltages (e.g., bias voltages) can be applied to the word lines 222, bit lines 220, and source line 229. The particular voltages applied depends on the memory operation being performed, and different voltages may be applied to the word lines 222 during a particular memory operation in order to store data in a cell (or page of cells) or read data from a cell. For example, an erase operation to remove data from a selected group of memory cells (e.g., a selected programmed deck) can include applying a relatively high voltage (e.g., 20V) to the source line 229, the relatively high voltage (e.g., 20V) to unselected word lines (e.g., word lines coupled to cells of a programmed deck and/or a deck not being erased), and a relatively low voltage (e.g., 0V) to the selected word lines (e.g., the word lines coupled to the deck being erased), which results in erasing of the cells of the selected programmed deck by removing charge from their charge storage nodes (e.g., charge-trap layers or floating gates) and thereby reducing their Vt levels to near 0V, for example. Additional example biasing schemes are described in more detail in association with FIG. 3.

Figure 3:
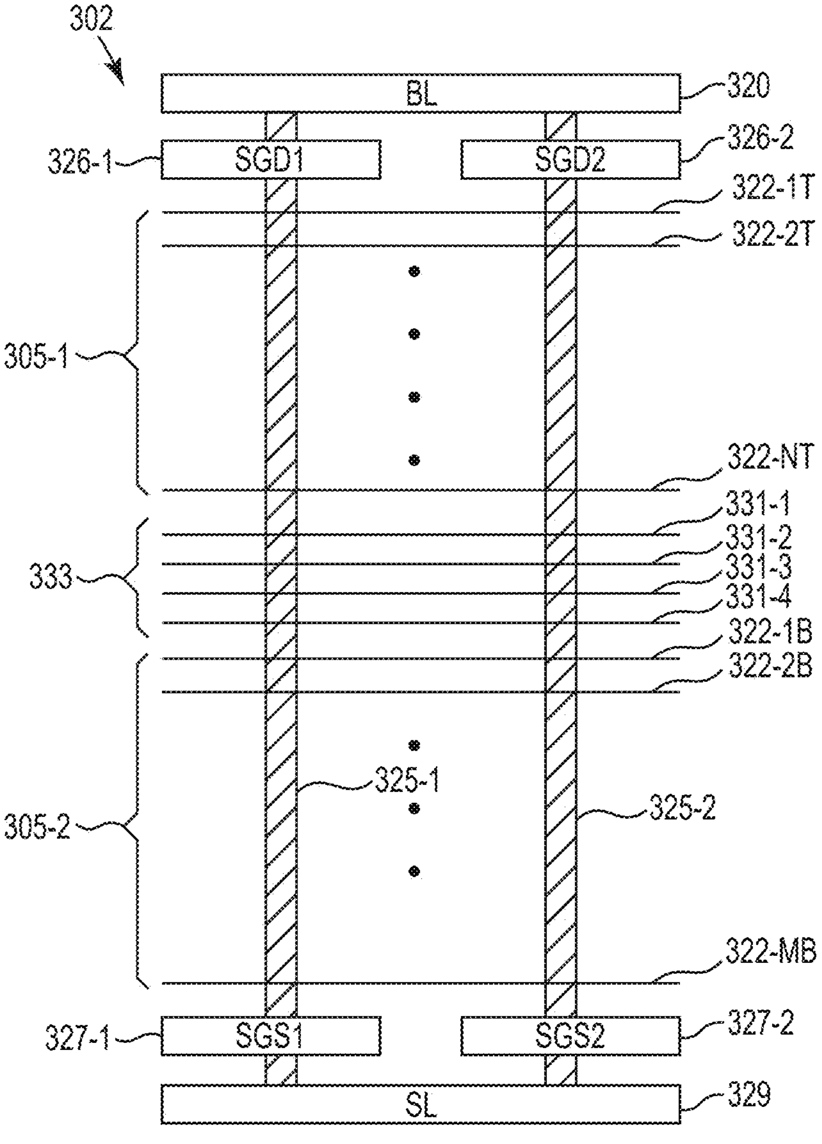
FIG. 3 schematically illustrates a portion of a memory array having multiple erase blocks per string and that can be operated in accordance with various embodiments of the present disclosure.

As described further in FIG. 3, the memory cells 223 of the array 202 can represent a physical block of memory cells that can comprise multiple (e.g., two or more) physical erase blocks. As an example, the word lines 222-0 and 222-1 can be coupled to cells of a first erase block, and the word lines 222-2 and 222-3 can be coupled to cells of a second/different erase block. Therefore, the cells 223-0 and 223-1 of the nine respective strings 225 (e.g., the cells of the first erase block) share respective common strings (e.g., common channel) with the cells 223-2 and 223-3 (e.g., the cells of the second erase block).

As further described herein, an array (e.g., 202) can comprise a number of word lines physically between (e.g., separating) the word lines (e.g., 222) corresponding to different erase blocks. The word lines separating word lines corresponding to different erase blocks can be referred to as "dummy" word lines and can be coupled to dummy memory cells (e.g., within the strings 225) that are not used to store data. The dummy word lines and/or dummy cells can facilitate the ability to perform erase operations separately on erase blocks that share a common string or strings. For example, one erase block within a physical block can be erased without erasing one or more other erase blocks within the physical block. The quantity of dummy word lines between erase blocks can vary, and various bias voltages can be applied to the dummy word lines during the various memory operations performed on the erase blocks.

In operation, erase blocks can be separately (e.g., individually) selected or deselected. For example, an erase operation can be performed on a selected first erase block corresponding to a group of strings while another erase block(s) corresponding to the same group of strings is deselected for the erase operation (e.g., such that is not erased). As described further herein, the ability to independently operate (e.g., write, read, erase) erase blocks within a physical block can result in challenges associated with programming and/or erasing erase blocks that are not adjacent to a drain side or a source side of a string. Various embodiments described herein can address such challenges by implementing a logical block construction that involves grouping erased erase blocks in a manner such that middle erase blocks have access to either a source side or a drain side of a string.

FIG. 3 schematically illustrates a portion of a memory array 302 having multiple erase blocks per string that can be operated in accordance with various embodiments of the present disclosure. The example shown can be a portion of the array 202 described in FIG. 2. The array portion 302 can be a portion of a physical block of memory cells that includes multiple erase blocks (e.g., decks).

In this example, the array 302 includes a plurality/group of word lines 322-1T, 322-2T, . . . , 322-NT corresponding to a first erase block 305-1 (e.g., a top deck) and a plurality/group of word lines 322-1B, 322-2B, . . . , 322-MB corresponding to a second erase block 305-2 (e.g., bottom deck). The designators "N" and "M" can represent various numbers (e.g., 3 or more) and "N" and "M" can be the same number. Accordingly, embodiments are not limited to a particular quantity of word lines 322 for the top deck 305-1 or bottom deck 305-2 (the designator "T" corresponding to "top" and the designator "B" corresponding to "bottom"). The array 302 also includes a number of dummy word lines 331-1, 331-2, 331-3, and 331-4, which can be collectively referred to as word lines 331. The dummy word lines 331 correspond to a separation region 333 between the top deck 305-1 and bottom deck 305-2. Although four word lines 331 are illustrated, embodiments can include more or fewer than four dummy word lines 331 separating erase blocks corresponding to same strings.

The array portion 302 illustrates two strings 325-1 and 325-2 for ease of illustration; however, embodiments can include many more strings 325. Memory cells are located at the intersections of the word lines 322/331 and strings 325, with the memory cells of a particular string 325 sharing a common channel region (e.g., pillar) as described in FIG. 2. The dummy word lines 331 can be coupled to dummy memory cells (e.g., cells that are not addressable to store user data).

As illustrated in FIG. 3, a first end of the strings 325-1 and 325-2 can be coupled to a common source line 329 via respective select gate source lines 327-1 (SGS1) and 327-2 (SGS2). The second/opposite end of the strings 325-1 and 325-2 can be coupled to a bit line 320 via respective select gate drain lines 326-1 (SGD1) and 326-2 (SGD2). As such, the strings 325 (e.g., the cells thereof) can be individually accessed using the bit line 320 and select gates to which the lines 326-1 and 326-2 are coupled. Although only a single bit line 320 is shown, embodiments can include multiple bit lines such as shown in FIG. 2, for example.

As noted herein, in various embodiments, the top deck 305-1 and the bottom deck 305-2 can be read, programmed, and/or erased via separate operations even though the cells of the decks 305-1/305-2 share the same strings 325-1/325-2. For example, each one of the decks 305-1 and 305-2 can be individually programmed and/or erased without programming or erasing the other of the decks 305-1 and 305-2.

Figure 4:
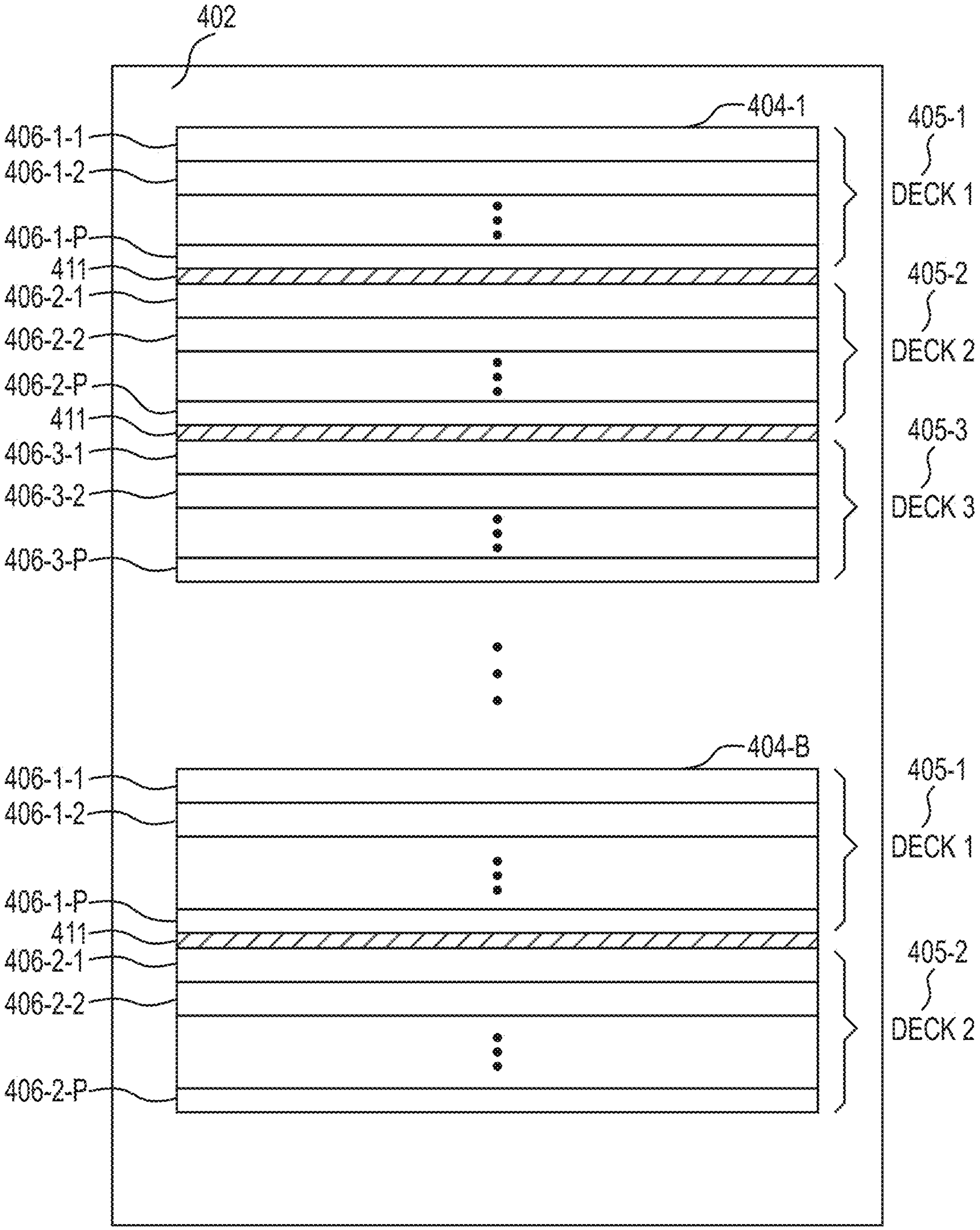
FIG. 4 illustrates a portion of a memory array having multiple erase blocks per string and that can be operated in accordance with various embodiments of the present disclosure.

Although only two decks (e.g., a top deck and a bottom deck) are illustrated in FIG. 3, the array 302 can include one or more intermediate/middle decks located between the top deck 305-1 and bottom deck 305-2 (e.g., as described further in FIG. 4).

FIG. 4 illustrates a portion of a memory array 402 having multiple erase blocks per string and that can be operated in accordance with various embodiments of the present disclosure. The memory array 402 includes multiple physical blocks 404-1, . . . , 404-B and can be operated in accordance with one or more embodiments of the present disclosure. The indicator "B" is used to indicate that the array 402 can include a number of physical blocks 404. As an example, the number of physical blocks in array 402 can be 128 blocks, 512 blocks, or 1,024 blocks, but embodiments are not limited to a particular multiple of 128 or to any particular number of physical blocks in an array 402. The memory array 402 can be, for example, a NAND flash memory array (e.g., a 3D NAND flash array such as array 102, 202, and/or 302).

Each of the physical blocks 404-1, . . . , 404-B includes multiple erase blocks. In this example, the physical blocks 404 have different respective quantities of erase blocks; however, embodiments are not so limited (e.g., the physical blocks 404 can all have a same quantity of erase blocks). In this example, physical block 404-1 includes a first erase block 405-1 (DECK_1), a second erase block 405-2 (DECK_2), and a third erase block 405-3 (DECK_3) separated by respective regions 411, which can correspond to a region of dummy word lines such as word lines 331 shown in FIG. 3. Physical block 404-B includes a first erase block 405-1 (DECK_1) and a second erase block 405-2 (DECK_2) separated by a region 411.

As described above, the decks 405 within a physical block 404 are commonly coupled to the strings of the respective blocks 404 with the decks 405 being separately erasable via a block erase operation (e.g., deck 405-1 can be erased without erasing decks 405-2 and/or deck 405-3) and separately programmable. Although the physical blocks 404 are shown as including two decks or three decks, embodiments are not so limited. For example, the physical blocks 404 can include more than three.

Each deck 405 can comprise a number of physical pages, which can correspond to a "row" of the array corresponding to a particular word line. As shown, deck 405-1 comprises pages 406-1-1, 406-1-2, . . . , 406-1-P, deck 405-2 comprises pages 406-2-1, 406-2-2, . . . , 406-2-P, and deck 405-3 comprises pages 406-3-1, 406-3-2, . . . , 406-3-P. The designator "P" is used to indicate that the decks 405 can comprise a plurality of pages/rows. Each physical page (collectively referred to as pages 406) can store multiple logical pages of data. A page can refer to a unit of programming and/or reading (e.g., a group of cells that are programmed and/or read together as a functional group).

As described further below in association with FIGS. 5A, 5B and 6, various embodiments of the present disclosure involve implementing a logical block construction that can avoid the situation in which a middle deck (e.g., deck 405-2 of block 404-1) does not have access to either a source end or a drain end of a string through an adjacent erased deck. For example, a middle deck (e.g., deck 405-2 of block 404-1) can be paired with an adjacent deck that is adjacent to a source end or drain end of the string (e.g., either deck 405-1 of block 404-1 or deck 405-3 of block 404-1) such that the logical block comprises either a combination of decks 404-1 and 404-2 of block 404-1 or decks 404-2 and 404-3 of block 404-1. Since the constituent decks of a logical block are erased and programmed together as a unit, such a logical block implementation can ensure that a middle deck can be more easily programmed and/or erased as compared to instances in which the middle deck may not have access to a source or drain end of a string through erased word lines. As noted herein, it can be difficult, for example, to pass a seed voltage to a middle deck through a programmed deck in association with programming the middle deck. (e.g., since it is more challenging to pass the seed through a string coupled to programmed word lines than through a string coupled to erased word lines)

Figure 5A:
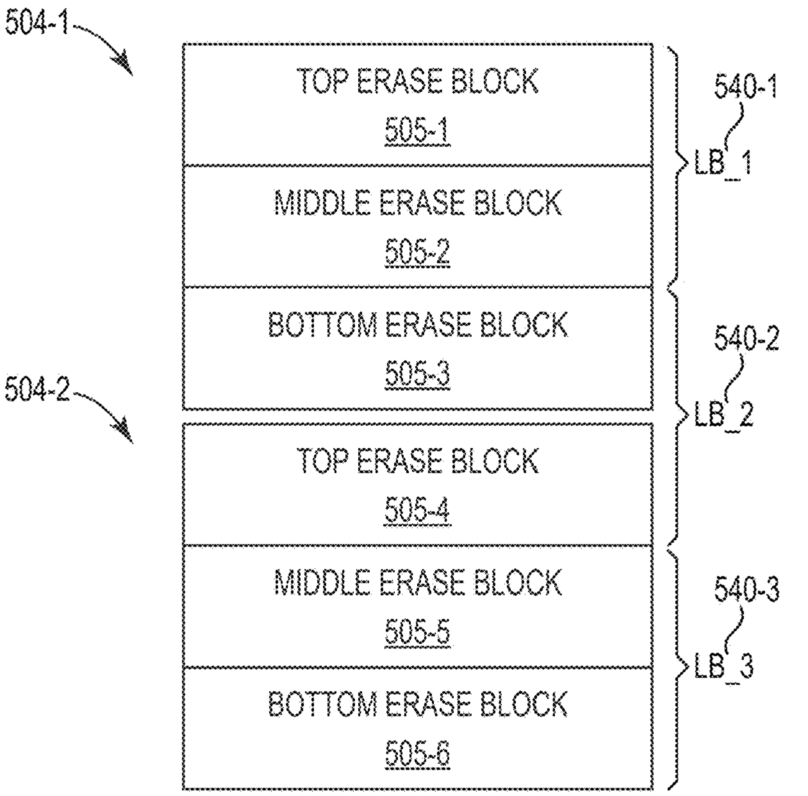
FIG. 5A illustrates example groupings of erase blocks into logical blocks in accordance with various embodiments of the present disclosure.
Figure 5B:
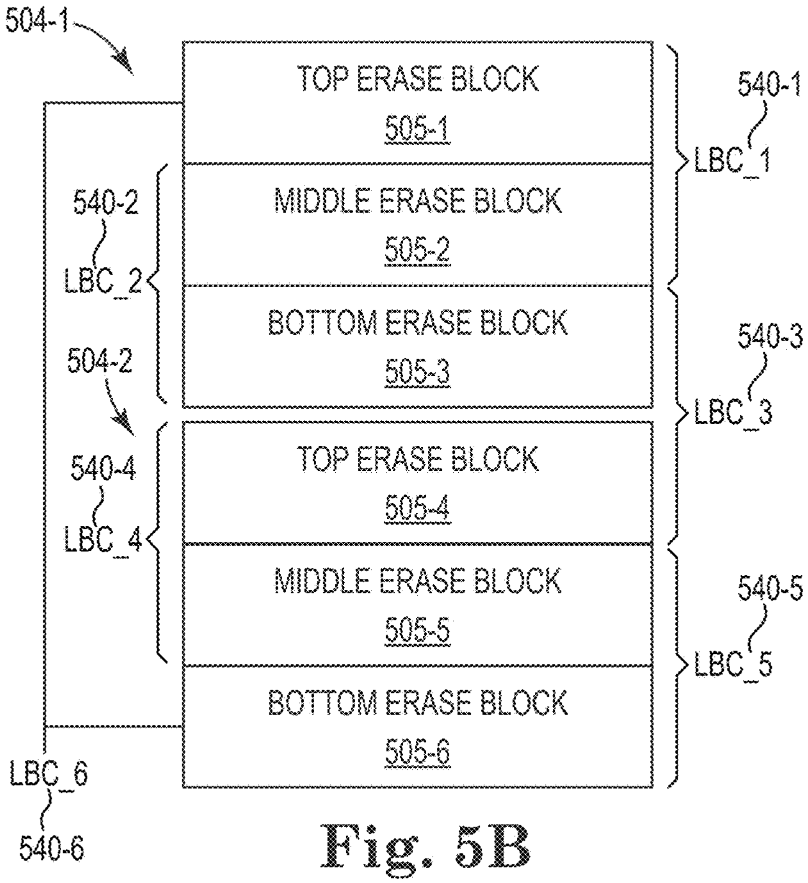
FIG. 5B illustrates example groupings of erase blocks into logical blocks in accordance with various embodiments of the present disclosure.

FIG. 5A and FIG. 5B illustrate example groupings of erase blocks into logical blocks in accordance with various embodiments of the present disclosure. The examples illustrated in FIG. 5A and FIG. 5B relate to embodiments in which physical blocks (e.g., physical blocks 504-1 and 504-2) include an odd number of erase blocks (referred to collectively as erase blocks 505). In these examples, each of the physical blocks 504-1 and 504-2 include three erase blocks 505; however, embodiments are not so limited. As illustrated in FIG. 5A and FIG. 5B, physical block 504-1 includes a top erase block 505-1, a middle erase block 505-2, and a bottom erase block 505-3, and physical block 504-2 includes a top erase block 505-4, a middle erase block 505-5, and a bottom erase block 505-6. The physical blocks 504 and erase blocks 505 can be analogous to those described previously herein. Each of the top erase blocks 505-1/505-4 are adjacent to either a source end or a drain end of a string corresponding to the respective physical block. Similarly, each of the bottom erase blocks 505-3/505-6 are adjacent to the other of the source end or the drain end of the corresponding string. The erase blocks 505-1, 505-2, and 505-3 comprise cells coupled to a same string (e.g., they are located in a same physical block 504-1), and the erase blocks 505-4, 505-5, and 505-6 comprise cells coupled to a different string (e.g., they are located in a different physical block 504-2).

The examples of FIG. 5A and FIG. 5B represents a logical block implementation in which three logical blocks (referred to collectively as logical blocks 540) are formed from the three erase blocks of two respective physical blocks 504-1 and 504-2 such that each logical block 540 includes a pair of erase blocks 505. Accordingly, the logical block size is ⅔ of the physical block size. As described herein, the logical blocks 540 are constructed such that each of the constituent erase blocks 505 has access to either a source side or a drain side of one of the physical blocks 504-1 and 504-2.

The example of FIG. 5A illustrates a "static" grouping in which the erase blocks 505 assigned to a particular logical block 540 does not vary. For instance, in this example, the erase blocks 505-1/505-2 correspond to block 540-1 (LB_1), the erase blocks 505-3/505-4 correspond to logical block 540-2 (LB_2), and the erase blocks 505-5/505-6 correspond to logical block 540-3 (LB_3).

In contrast, the example of FIG. 5B illustrates a "dynamic" grouping in which the erase blocks 505 assigned to a particular logical block 540 is variable (e.g., selectable). For instance, in the example of FIG. 5B, the particular logical block 540 to which a particular erase block 505 is assigned is variable among a number of logical block "candidates" (LBCs) 540-1 (LBC_1), 540-2 (LBC_2), 540-3 (LBC_3), 540-4 (LBC_4), 540-5 (LBC_5), and 540-6 (LBC_6). For example, erase block 505-1 can be paired with erase block 505-2 as logical block 540-1 or with erase block 505-6 as logical block 540-6. Erase block 505-2 can be paired with erase block 505-1 as logical block 540-1 or with erase block 505-3 as logical block 540-2. Erase block 505-3 can be paired with erase block 505-2 as logical block 540-2 or with erase block 505-4 as logical block 540-3. Erase block 505-4 can be paired with erase block 505-3 as logical block 540-3 or with erase block 505-5 as logical block 540-4. Also, erase block 505-5 can be paired with erase block 505-4 as logical block 540-4 or with erase block 505-6 as logical block 540-6.

Providing the ability to dynamically form the logical blocks 540 can provide various benefits. For example, a particular combination of logical block candidates 540-1 to 540-6 can be selected based on an amount of valid data within the respective erase blocks 505. For instance, a combination can be selected that results in a least amount of valid data, which can reduce the garbage collection and/or write amplification associated with operating the array. The amount of valid data per erase block 505 can be tracked, for example, by a controller such as controller 891 described in FIG. 8.

Figure 6:
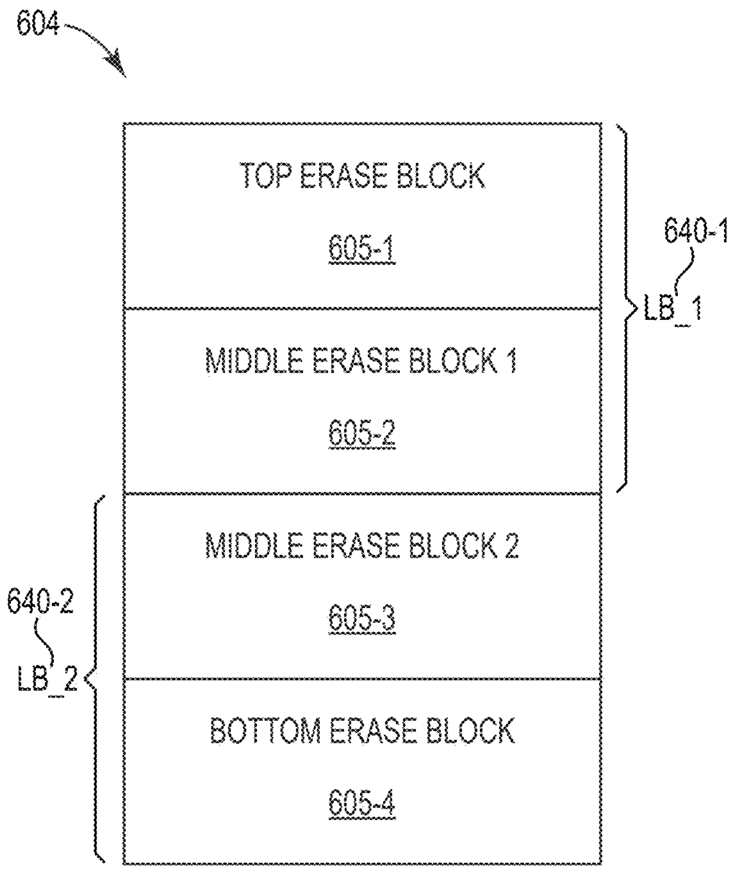
FIG. 6 illustrates example groupings of erase blocks into logical blocks in accordance with various embodiments of the present disclosure.

FIG. 6 illustrates example groupings of erase blocks into logical blocks in accordance with various embodiments of the present disclosure. The example illustrated in FIG. 6 relates to embodiments in which physical blocks 604 include an even number of erase blocks (referred to collectively as erase blocks 605). In this example, the physical block 604 includes four erase blocks 605; however, embodiments are not so limited. As illustrated in FIG. 6, physical block 604 includes a top erase block 605-1, a first middle erase block 605-2, a second middle erase block 605-3, and a bottom erase block 605-4. The physical block 604 and erase blocks 605 can be analogous to those described previously herein. For example, the top erase block 605-1 is adjacent to one of either a source end or a drain end of a string corresponding to the physical block, and the bottom erase block 605-4 is adjacent to the other of the source end or the drain end of the corresponding string.

The example of FIG. 6 represents a "static" logical block implementation in which half of the erase blocks correspond to one of two logical blocks (referred to collectively as logical blocks 640), and the other half of the erase blocks correspond to the other of the two logical blocks. In this example, logical block 640-1 (LB_1) comprises erase blocks 605-1 and 605-2, and logical block 640-2 comprises erase blocks 605-3 and 605-4. Accordingly, the logical block size is ½ of the physical block size. As described herein and as shown in FIG. 6, the logical blocks 640 are constructed such that each of the constituent erase blocks 605 has access to either a source side or a drain side of one of the physical block 604.

Figure 7:
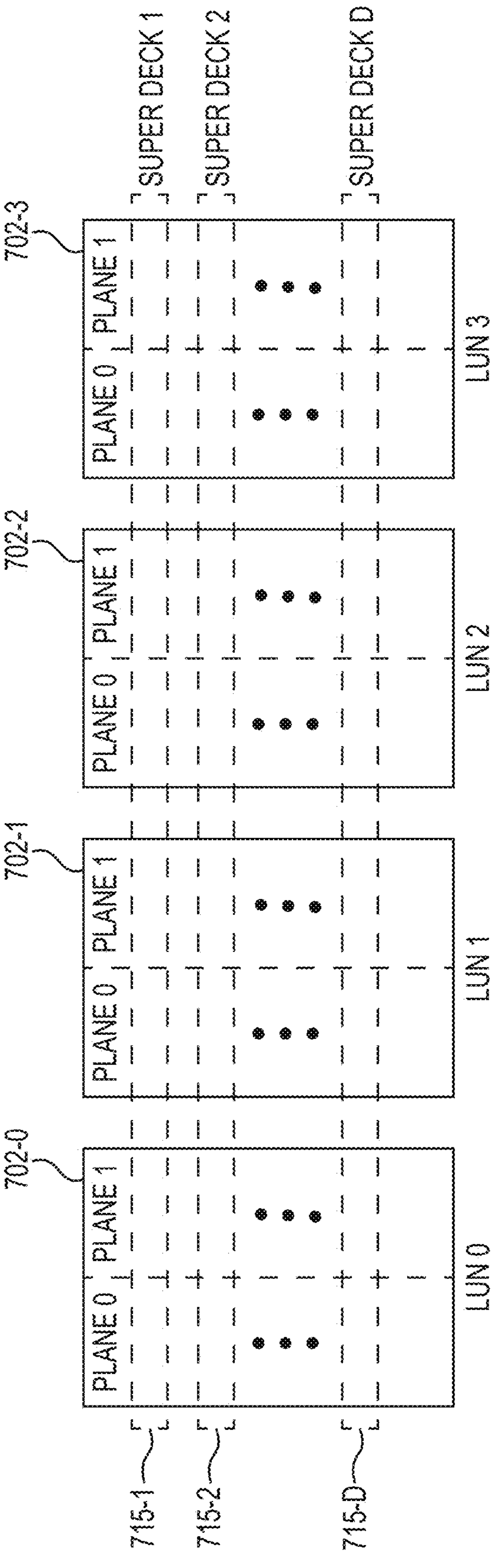
FIG. 7 illustrates a portion of a memory device having multiple erase blocks per string in accordance with various embodiments of the present disclosure.

FIG. 7 illustrates a portion of a memory device having multiple erase blocks per string in accordance with various embodiments of the present disclosure. In various embodiments, the physical blocks of a memory array can be organized into planes. For example, FIG. 7 illustrates memory arrays 702-0, 702-1, 702-2, and 702-3 each divided into a first plane (PLANE 0) of physical blocks and a second plane (PLANE 1) of physical blocks. Embodiments are not limited to a particular quantity of planes per array. Each array 702-0, 702-1, 702-2, and 702-3 corresponds to a respective logical unit (LUN) LUN0, LUN1, LUN2, and LUN3. Each LUN can correspond to a different memory device (e.g., memory device 100 shown in FIG. 1); however, embodiments are not so limited. For example, a memory device (e.g., die) can include multiple LUNs. A LUN can, for example, correspond to a smallest unit that can independently execute commands and report status.

The physical blocks of the planes can comprise multiple erase blocks sharing common strings as described herein. The physical blocks can be grouped into "super blocks" with each super block comprising a physical block from each plane (e.g., PLANE 0 and PLANE 1) across multiple LUNs (e.g., across multiple arrays 702). Similarly, embodiments of the present disclosure an include a number of super decks 715-1 (SUPER DECK_1), 715-2 (SUPER DECK_2), . . . , 715-D (SUPER DECK_D). Each super deck (or super erase block) 715 can comprise a deck from each plane across multiple LUNs. For example, a first super deck 715-1 (SUPER DECK_1) can comprise a deck from plane 0 of LUN0, a deck from plane 1 of LUN1, a deck from plane 0 of LUN1, a deck from plane 1 of LUN1, a deck from plane 0 of LUN2, a deck from plane 1 of LUN2, a deck from plane 0 of LUN3, and a deck from plane 1 of LUN3.

Embodiments of the present disclosure can monitor temperature classification information on a super deck level as well as, or instead of, on a deck level. For instance, consider an example in which the constituent decks of a super deck 715-1 share common strings with the respective constituent decks of a super deck 715-2 (e.g., super decks 715-1 and 715-2 are located in a same physical super block). The decks of super deck 715-1 can be erased together as a group.

Figure 8:
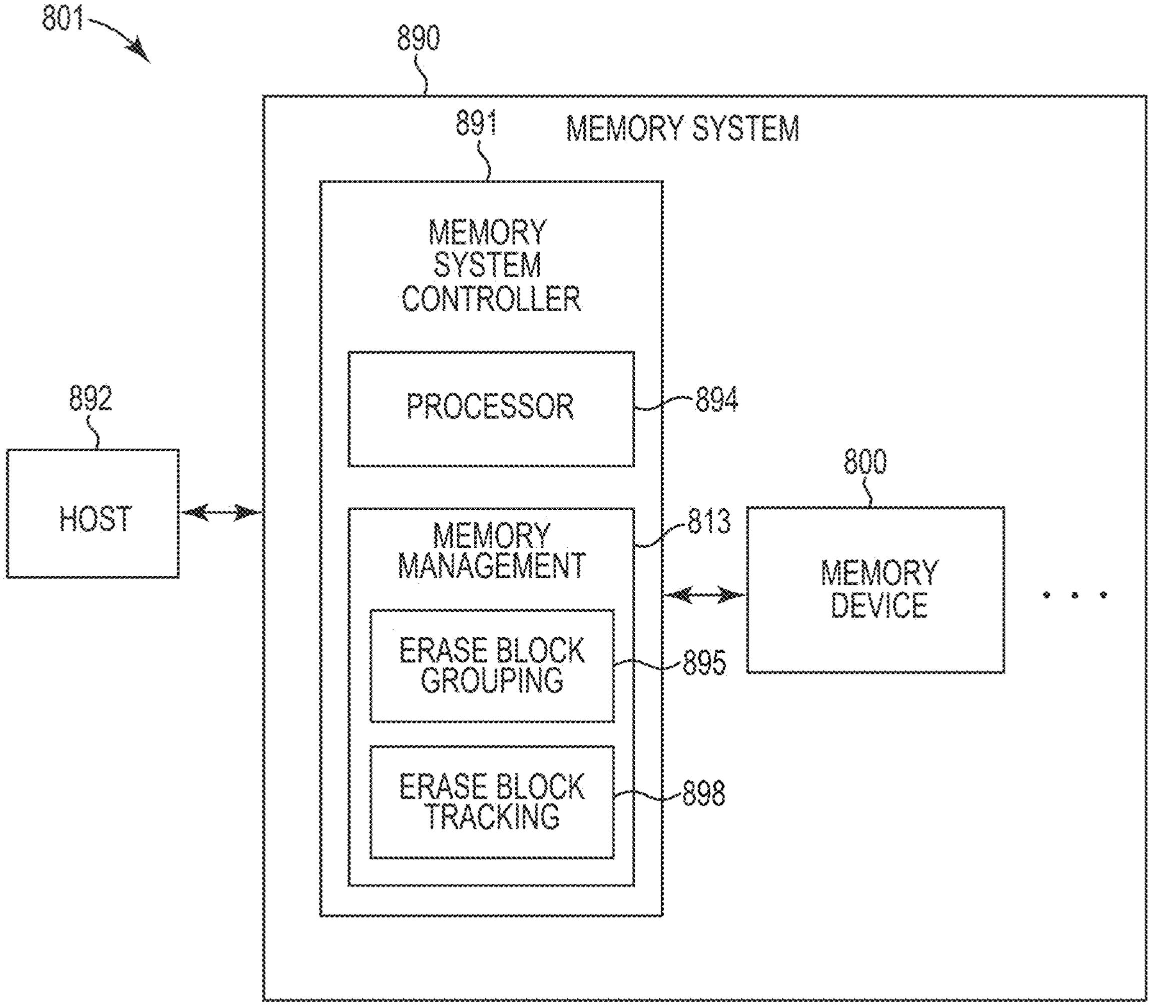
FIG. 8 illustrates an example computing system having a memory system for performing logical block construction for physical blocks comprising multiple erase blocks coupled to a same string in accordance with various embodiments of the present disclosure.

FIG. 8 illustrates an example computing system 801 having a memory system 890 for performing logical block construction for physical blocks comprising multiple erase blocks coupled to a same string in accordance with various embodiments of the present disclosure. As shown in FIG. 8, the memory system 890 includes a system controller 891 and a number of memory devices 800, which can be memory devices such as device 100 described in FIG. 1 (e.g., memory devices comprising memory arrays having multiple erase blocks coupled to common strings).

In some embodiments, the memory system 890 is a storage system. An example of a storage system is a solid-state drive (SSD). In some embodiments, the memory system 890 is a hybrid memory/storage sub-system. In general, the computing environment shown in FIG. 8 can include a host system 892 that uses the memory system 890. For example, the host system 892 can write data to the memory system 890 and read data from the memory system 890.

The memory system controller 891 (hereinafter referred to as "controller") can communicate with the memory devices 800 to perform operations such as reading data, writing data, or erasing data at the memory devices 800 and other such operations. The controller 891 can include hardware such as one or more integrated circuits and/or discrete components, a buffer memory, or a combination thereof. The controller 891 can include a microcontroller, special purpose logic circuitry (e.g., a field programmable gate array (FPGA), an application specific integrated circuit (ASIC), etc.), or other suitable processing circuitry. The controller 891 can include a processing device (e.g., processor 894) configured to execute instructions stored in local memory (not shown).

In this example, the controller 891 includes a memory management component 813. The memory management component 813 can be associated with a flash translation layer (FTL), for example. The component 813 can be responsible for, among other things, operating a memory array of memory device 800 in accordance with a logical block implementation in which each logical block comprises: a first erase block adjacent to a first end of a particular string corresponding to a first physical block; and a second erase block. The second erase block is either: located in the first physical block and not adjacent to a second end of the particular string corresponding to the first physical block; or located in a second physical block and adjacent to a first end of a particular string corresponding to the second physical block. The memory management component can also be responsible for tracking an amount of valid data on a per erase block basis, and dynamically group logical blocks based, at least partially, on the amount of valid data per erase block.

In general, the controller 891 can receive commands or operations from the host system 892 and can convert the commands or operations into instructions or appropriate commands to achieve the desired access to the memory devices 800. The controller 891 can be responsible for other operations such as wear leveling operations, garbage collection operations, error detection and error-correcting code (ECC) operations, encryption operations, caching operations, and address translations between a logical block address and a physical block address that are associated with the memory devices 800. Garbage collection can involve moving valid data (e.g., pages) of an erase block (e.g., source block) to a different erase block (e.g., destination block) in order to erase the source block and add it to a pool of available free erase blocks. Garbage collection is often performed as a background operation (e.g., by system controller 891) such that it is transparent to the host 892.

The host system 892 can be a computing device such as a desktop computer, laptop computer, network server, mobile device, or other such computing device that includes a memory and a processing device. The host system 892 can include, or be coupled to, the memory system 890 so that the host system 892 can read data from or write data to the memory system 890. The host system 892 can be coupled to the memory system 890 via a physical host interface (not shown in FIG. 8). As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, a universal flash storage (UFS) interface, a universal serial bus (USB) interface, Fibre Channel, Serial Attached SCSI (SAS), etc. The physical host interface can be used to transmit data between the host system 892 and the memory system 890. The host system 892 can further utilize an NVM Express (NVMe) interface to access the memory devices 800 when the memory system 890 is coupled with the host system 892 by the PCIe interface. The physical host interface can provide an interface for passing control, address, data, and other signals between the memory system 890 and the host system 892.

While the example memory system 890 in FIG. 8 has been illustrated as including the controller 891, in another embodiment of the present disclosure, a memory system 890 may not include a controller 891, and can instead rely upon external control (e.g., provided by a processor or controller separate from the memory system 890, such as by host 892 communicating directly with the memory devices 800).

Although the memory system 890 is shown as physically separate from the host 892, in a number of embodiments the memory system 890 can be embedded within the host 892. Alternatively, the memory system 890 can be removable from the host 892.

As used herein, an "apparatus" can refer to various structural components. For example, the computing system 801 shown in FIG. 8 can be considered an apparatus. Alternatively, the host 892, the controller 891, and the memory device 800 might each separately be considered an apparatus.

Various methods of the present disclosure can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method, or portions thereof are performed by the control circuitry 110 of FIG. 1 and/or the controller 891 of FIG. 8.

One example method can include forming, via a controller coupled to a memory array comprising a plurality of physical blocks of memory cell, logical block groupings for the erase blocks in accordance with a particular logical block implementation. Each physical block of the plurality can comprise more than two erase blocks, with each of the more than two erase blocks of each respective physical block comprising memory cells coupled to a same string of memory cells corresponding to the respective physical block. The logical block groupings can be formed such that each logical block comprises: a first erase block adjacent to a first end of a particular string corresponding to a first physical block; and a second erase block. The second erase block is either: located in the first physical block and not adjacent to a second end of the particular string corresponding to the first physical block; or located in a second physical block and adjacent to a first end of a particular string corresponding to the second physical block.

In a number of embodiments, the method can include determining the logical block groupings such that any erase blocks that are not adjacent to either end of the particular string corresponding to the first physical block or either end of the particular string corresponding to the second physical block are adjacent to an erase block that is adjacent to either end of the particular string corresponding to the first physical block or either end of the particular string corresponding to the second physical block. Various embodiments can include tracking, via the controller, an amount of valid data on an erase block basis, and dynamically adjusting, via the controller, the logical block groupings based on determined changes in the amount of valid data per erase block. The erase blocks can be grouped to facilitate passage of a seed voltage to intermediate erase blocks in association with programming the intermediate erase blocks. The example method can include performing, via the controller, an operation (e.g., a programming and/or erase operation) on the erase blocks based on the determined logical block groupings.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, which manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, which can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The figures herein follow a numbering convention in which the first digit or digits correspond to the drawing figure number and the remaining digits identify an element or component in the drawing. Similar elements or components between different figures may be identified by the use of similar digits. For example, 102 may reference element "02" in FIG. 1, and a similar element may be referenced as 502 in FIG. 5. As will be appreciated, elements shown in the various embodiments herein can be added, exchanged, and/or eliminated so as to provide a number of additional embodiments of the present disclosure.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B and C). Additionally, the phrase "at least one of A and B" means one or more of (A) or one or more of (B), or one or more of (A) and one or more of (B) such that both one or more of (A) and one or more of (B) is not required.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:

a memory array comprising a plurality of physical blocks of memory cells, wherein each physical block of the plurality comprises more than two erase blocks, with each of the more than two erase blocks of each respective physical block comprising memory cells coupled to a same string of memory cells corresponding to the respective physical block; and a controller coupled to the memory array and configured to operate the memory array in accordance with a logical block implementation in which each logical block comprises:

a first erase block adjacent to a first end of a particular string corresponding to a first physical block; and a second erase block, wherein the second erase block is either:

located in the first physical block and not adjacent to a second end of the particular string corresponding to the first physical block; or located in a second physical block and adjacent to a first end of a particular string corresponding to the second physical block; and wherein each physical block comprises three erase blocks, and wherein the logical block implementation includes grouping the three erase blocks from each of two physical blocks into three logical blocks with each of the three logical blocks corresponding to two different erase blocks.

2. The apparatus of claim 1, wherein the controller is configured to:

track an amount of valid data on a per erase block basis; and dynamically group logical blocks based, at least partially, on the amount of valid data per erase block.

3. The apparatus of claim 1, wherein the controller is configured to provide a static grouping for the three erase blocks from each of the two physical blocks such that the two different erase blocks corresponding to each of the respective three logical blocks does not change.

4. The apparatus of claim 1, wherein the controller is configured to provide a dynamic grouping for the three erase blocks from each of the two physical blocks such that the two different erase blocks corresponding to each of the respective three logical blocks is adjustable.

5. The apparatus of claim 1, wherein:

the first erase block of a first logical block is adjacent to the first end of the particular string corresponding to the first physical block;

the second erase block of the first logical block is located in the first physical block and not adjacent to the second end of the particular string corresponding to the first physical block; and the first erase block of a second logical block is adjacent to a second end of the particular string corresponding to the first physical block.

6. The apparatus of claim 5, wherein:

the first end of the particular string corresponding to the first physical block is one of a source end of the particular string and a drain end of the particular string, and the second end of the particular string corresponding to the first physical block is the other one of the source end of the particular string and the drain end of the particular string; and the second erase block of the second logical block is located within a second physical block and is adjacent to a first end of a particular string corresponding to the second physical block.

7. The apparatus of claim 1, wherein:

the first erase block of a first logical block is adjacent to the first end of the particular string corresponding to the first physical block; and the second erase block of the first logical block is located in a second physical block and adjacent to a second end of a particular string corresponding to the second physical block.

8. The apparatus of claim 1, wherein the first end of the particular string corresponding to the first physical block is a source end of the particular string, and the second end of the particular string corresponding to the first physical block is a drain end of the string, and wherein the first physical block comprises:

the first erase block adjacent to the source end of the particular string;

the second erase block adjacent to the drain end of the string; and at least one intermediate erase block located between the first erase block and the second erase block.

9. The apparatus of claim 1, wherein the memory array comprises replacement gate NAND memory cells.

10. A method, comprising:

forming, via a controller coupled to a memory array comprising a plurality of physical blocks of memory cells, wherein each physical block of the plurality comprises more than two erase blocks, with each of the more than two erase blocks of each respective physical block comprising memory cells coupled to a same string of memory cells corresponding to the respective physical block, logical block groupings for the erase blocks in accordance with a particular logical block implementation;

wherein forming the logical block groupings comprises grouping the erase blocks such that each logical block comprises:

a first erase block adjacent to a first end of a particular string corresponding to a first physical block; and a second erase block, wherein the second erase block is either:

located in the first physical block and not adjacent to a second end of the particular string corresponding to the first physical block; or located in a second physical block and adjacent to a first end of a particular string corresponding to the second physical block; and performing an operation on the erase blocks based on the formed logical block groupings;

wherein the method includes determining the logical block groupings such that any erase blocks that are not adjacent to either end of the particular string corresponding to the first physical block or either end of the particular string corresponding to the second physical block are adjacent to an erase block that is adjacent to either end of the particular string corresponding to the first physical block or either end of the particular string corresponding to the second physical block.

11. The method of claim 10, wherein the method includes:

tracking, via the controller, an amount of valid data on an erase block basis; and dynamically adjusting, via the controller, the logical block groupings based on determined changes in the amount of valid data per erase block.

12. The method of claim 10, wherein at least some of the plurality of physical blocks comprise an even quantity of erase blocks, and wherein the particular logical block implementation comprises grouping the erase blocks such that each logical block comprises half of the erase blocks within a respective one of the at least some of the plurality of physical blocks.

13. The method of claim 10, wherein the method includes grouping the erase blocks to facilitate passage of a seed voltage to intermediate erase blocks in association with programming the intermediate erase blocks.

14. The method of claim 10, wherein forming the logical block groupings comprises forming three logical blocks out of every two physical blocks of the plurality of physical blocks.

15. An apparatus, comprising:

a memory array comprising:

a first physical block of memory cells comprising at least three erase blocks each comprising memory cells coupled to a first string of memory cells corresponding to the first physical block;

a second physical block of memory cells comprising at least three erase blocks each comprising memory cells coupled to a second string of memory cells corresponding to the second physical block; and a controller coupled to the memory array and configured to:

determine a plurality of logical block groupings of the erase blocks of the first and second physical blocks; and perform a memory operation in accordance with the determined logical block groupings of the erase blocks;

wherein the plurality of logical block groupings comprises:

a first grouping comprising a first erase block adjacent to a first end of the first string and a second erase block adjacent to the first erase block;

a second grouping comprising third erase block adjacent to a first end of the second string and a fourth erase block adjacent to the third erase block; and a third grouping comprising a fifth erase block adjacent to a second end of the first string and a sixth erase block adjacent to a second end of the second string.

16. The apparatus of claim 15, wherein the controller is configured to separately erase constituent erase blocks of the respective logical block groupings together.

17. The apparatus of claim 15, wherein each of the first physical block and the second physical block comprises a number of dummy word lines separating the erase blocks within the respective physical block.

18. An apparatus, comprising:

a memory array comprising a plurality of physical blocks of memory cells, wherein each physical block of the plurality comprises more than two erase blocks, with each of the more than two erase blocks of each respective physical block comprising memory cells coupled to a same string of memory cells corresponding to the respective physical block; and a controller coupled to the memory array and configured to operate the memory array in accordance with a logical block implementation in which each logical block comprises:

a first erase block adjacent to a first end of a particular string corresponding to a first physical block; and a second erase block, wherein the second erase block is either:

located in the first physical block and not adjacent to a second end of the particular string corresponding to the first physical block; or located in a second physical block and adjacent to a first end of a particular string corresponding to the second physical block;

wherein the first erase block of a first logical block is adjacent to the first end of the particular string corresponding to the first physical block;

wherein the second erase block of the first logical block is located in the first physical block and not adjacent to the second end of the particular string corresponding to the first physical block; and wherein the first erase block of a second logical block is adjacent to a second end of the particular string corresponding to the first physical block.

19. A method, comprising:

forming, via a controller coupled to a memory array comprising a plurality of physical blocks of memory cells, wherein each physical block of the plurality comprises more than two erase blocks, with each of the more than two erase blocks of each respective physical block comprising memory cells coupled to a same string of memory cells corresponding to the respective physical block, logical block groupings for the erase blocks in accordance with a particular logical block implementation;

wherein forming the logical block groupings comprises grouping the erase blocks such that each logical block comprises:

a first erase block adjacent to a first end of a particular string corresponding to a first physical block; and a second erase block, wherein the second erase block is either:

located in the first physical block and not adjacent to a second end of the particular string corresponding to the first physical block; or located in a second physical block and adjacent to a first end of a particular string corresponding to the second physical block; and performing an operation on the erase blocks based on the determined logical block groupings; and wherein at least some of the plurality of physical blocks comprise an even quantity of erase blocks, and wherein the particular logical block implementation comprises grouping the erase blocks such that each logical block comprises half of the erase blocks within a respective one of the at least some of the plurality of physical blocks.

* * * * *